Oct. 25, 1966 H. M. KEES ETAL 3,281,711
HIGH FREQUENCY NOISE GENERATOR
Filed Nov. 16, 1964
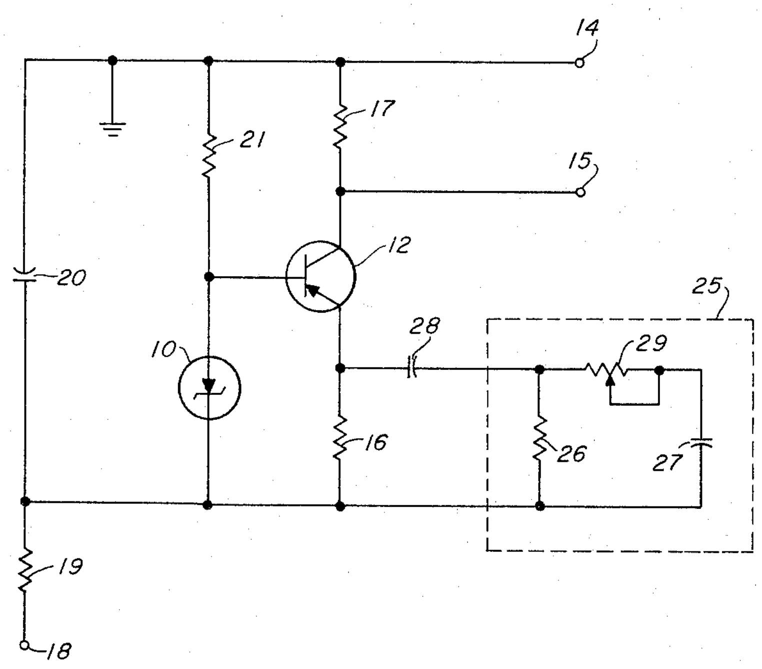
INVENTORS
HARVEY M. KEES
BERTRAM A. TREVOR
BY
ATTORNEYS

United States Patent Office 3,281,711

Patented Oct. 25, 1966

3,281,711

HIGH FREQUENCY NOISE GENERATOR

Harvey M. Kees and Bertram A. Trevor, Tucson, Ariz., assignors, by mesne assignments, to the United States of America as represented by the Secretary of the Navy Filed Nov. 16, 1964, Ser. No. 411,654
4 Claims. (Cl. 331—78)

The invention described herein may be manufactured and used by or for the Government of the United States of America for governmental purposes without the payment of any royalties thereon or therefor.

This invention relates to noise generators and is particularly directed to generators of the type which can deliver white noise voltages of considerable amplitude over a wide frequency band.

The object of this invention is to provide an improved noise generator.

A more specific object of this invention is to provide an improved noise generator which is capable of delivering a white noise frequency spectrum of uniform power throughout a wide frequency band, the generator being small in size and low in power consumption.

The features of this invention will be better understood by those skilled in the art by referring to the specific embodiment described in the following specification and shown in the accompanying drawing in which the single figure is a schematic circuit diagram of the preferred embodiment of the invention.

The primary noise source comprises the solid state diode 10 connected in the base-emitter input circuit of the isolation amplifier 12, the output of which includes the coupling resistor 17. The diode 10 is preferably of the Zener type which is back-biased by the direct current voltage source connected between terminal 18 and the ground. Series resistance 19 and smoothing condenser 20 are provided, as shown, for eliminating ripple or other unwanted voltage fluctuations from the power supply. The biasing circuit for the diode is completed through resistance 21 the value of which is adjusted to provide optimum bias voltage across the diode. With the diode polarized as shown, the transistor 12 should be of the PNP type with the emitter connected to the positive terminal of the source through the emitter resistor 16, and with the base of the transistor connected to the other terminal of the diode to forward bias the transistor. A constant output impedance across terminals 14 and 15 is maintained by the resistor 17. In case an output impedance of, say, 50 ohms is desired, the resistance 17 should be about 51 ohms. The impedance of the collector circuit of the transistor 12 is relatively high so that the output impedance is relatively independent of whether the noise source is on or off.

Frequency response equalization is obtained by partially bypassing the emitter resistance 16 of the transistor by the filter network 25 with appropriate frequency characteristics. Where the noise source is a solid state diode, the network connected across the emitter resistor should be, essentially, a low Q high-pass filter. The filter shown contains resistor 26 in parallel with condenser 27. Blocking condenser 28 is provided to prevent direct current short circuit of resistor 16. The resistance of resistor 29, adjustable from zero upward, may be added in series with condenser to adjust the effective capacity of condenser 27 in the filter.

The procedure for leveling the noise voltage at output terminals 14 and 15 requires first: installation of a value of resistance at 26 which sets the noise output at a level, say, 30 db above the normal thermal noise voltage, $kT$, at the terminals of the diode. If, for example, a level output between 2 and 32 megacycles is desired, the value of resistance 26 is adjusted to give the 30 db above $kT$ at 2 megacycles. Then, with resistance 29 reduced to 0 or short circuited, the value of the capacitance 27 is chosen to obtain the same output at 8 megacycles. Finally, the output level at 32 megacycles is checked and corrected by a small change in the value of condenser 27 or by adding resistance at 29. Occasionally it may be found necessary to repeat this equalizing procedure for optimum results. Flat response usually extends considerably above 32 megacycles and below 2 megacycles. The equalized amplifier, as shown, has negative voltage gain.

Variations of noise output amplitude of as much as several db can occur in some noise diodes due to fluctuations in supply voltage and ambient temperature. Such variations are not identical at all output frequencies. Thus in certain critical applications the D.C. supply voltage for the diode should be stabilized, and the temperature of the diode regulated in a temperature-stabilized oven.

With the equalization circuits shown the voltage at the output terminals 14 and 15 is high and is substantially constant over a wide frequency band when the following components and values are employed;

| | | |
|---|---|---|
| Transistor **12** | | 2N1195 |
| Diode **10** | | UZ707 |
| Resistor **16** | ohms | 4700 |
| Resistor **17** | do | 51 |
| Resistor **19** | do | 2700 |
| Resistor **21** | do | 1800 |
| Resistor **26** | do | 43 |
| Capacity **20** | mf. | 6.8 |
| Capacity **27** | pf. | 176 |
| Capacity **28** | mf. | 6.8 |
| D.C. source | volts | 28 |

Many modifications may be made in these values and in the details of the generator shown without departing from the scope of the appended claims.

What is claimed is:

1. In combination, a solid state diode with a voltage source connected across the diode to reversely bias the diode and generate noise voltages;
   - a transistor amplifier having a control electrode, an output electrode and a common electrode, with an input circuit coupled between the control electrode and the common electrode and an output circuit coupled between the output electrode and said common electrode;
   - a follower resistance common to both said input and output circuits and connected at one end to said common electrode, the noise generating diode being connected in said input circuit between the other end of said resistance and said control electrode;
   - a resistance-capacity network connected across said follower resistance, said network having a decreasing impedance with increasing frequency for proportionately amplifying the higher frequency components of said noise source to produce in said output circuit noise signals of substantially constant amplitude throughout a predetermined band of frequencies.

2. In combination in a noise generator;
   - a diode with a D.C. biasing circuit connected across said diode;
   - an isolation amplifier comprising a transistor with an input base-emitter circuit connected across said diode and an emitter resistance connected between one terminal of said diode and the emitter of said transistor;
   - an output impedance connected in the collector circuit of said transistor;
   - an equalization network, said network comprising a resistance and a condenser coupled in parallel across said emitter resistance, the values of said resistance and condenser being adjusted to provide high pass characteristics and substantially uniform noise signal amplitude throughout a predetermined frequency band across said output impedance.

3. The combination defined in claim 2 further comprising a blocking condenser connected between said network and said emitter resistance to prevent direct current short circuit of said emitter resistance.

4. The combination defined in claim 2, said network resistance having a value to set the output signal voltage at a predetermined power level at one frequency of said band, and said network condenser being adjusted in value to set the output at said level at a widely spaced frequency in said band.

References Cited by the Examiner

UNITED STATES PATENTS 3,165,707 1/1965 Clapper .............. 331—78

OTHER REFERENCES

Edwards: Electronics World, "White Noise," pp. 40–42, November 1962.

ROY LAKE, *Primary Examiner.*

J. KOMINSKI, *Assistant Examiner.*